(12) United States Patent
Yamamoto et al.

(10) Patent No.: US 10,903,238 B2
(45) Date of Patent: Jan. 26, 2021

(54) SEMICONDUCTOR DEVICE AND MANUFACTURING METHOD THEREOF

(71) Applicant: TOSHIBA MEMORY CORPORATION, Tokyo (JP)

(72) Inventors: Katsumi Yamamoto, Yokkaichi Mie (JP); Keisuke Kikutani, Yokkaichi Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/750,237

(22) Filed: Jan. 23, 2020

(65) Prior Publication Data
US 2020/0161331 A1      May 21, 2020

Related U.S. Application Data

(62) Division of application No. 16/105,892, filed on Aug. 20, 2018, now Pat. No. 10,573,660.

(30) Foreign Application Priority Data

Mar. 20, 2018    (JP) ................................ 2018-053207

(51) Int. Cl.
    *H01L 27/11582*      (2017.01)
    *H01L 21/311*      (2006.01)
    *H01L 21/762*      (2006.01)
    *H01L 29/06*      (2006.01)

(52) U.S. Cl.
CPC .. *H01L 27/11582* (2013.01); *H01L 21/31144* (2013.01); *H01L 21/76232* (2013.01); *H01L 29/0649* (2013.01)

(58) Field of Classification Search
CPC ........... H01L 27/11582; H01L 29/0649; H01L 21/76232; H01L 21/31144
See application file for complete search history.

(56) References Cited

U.S. PATENT DOCUMENTS

| 8,649,217 | B2 | 2/2014 | Kuniya et al. |
| 9,000,510 | B2* | 4/2015 | Hong ................ H01L 27/11582 |
| | | | 257/324 |
| 9,129,860 | B2 | 9/2015 | Fukuzumi et al. |
| 9,859,362 | B2 | 1/2018 | Konrath et al. |

(Continued)

FOREIGN PATENT DOCUMENTS

| JP | 2014-187246 A | 10/2014 |
| JP | 2016-213474 A | 12/2016 |

*Primary Examiner* — Syed I Gheyas
(74) *Attorney, Agent, or Firm* — Foley & Lardner LLP

(57) ABSTRACT

A semiconductor device includes a substrate, a stacked body provided on the substrate, a first insulator dividing the stacked body in a second direction crossing the first direction, a second insulator adjacent to the first insulator and dividing the stacked body in the second direction, a first hole, and a first insulating member. In the stacked body, a plurality of layers are stacked in a first direction perpendicular to the upper surface of the substrate. The first hole penetrates the stacked body and the first insulator in the first direction. The first insulating member penetrates the stacked body and the second insulator in the first direction and is adjacent to the first hole via a first electrode in a third direction crossing the first direction and the second direction, and has an opening diameter larger than that of the first insulator.

6 Claims, 15 Drawing Sheets

(56) References Cited

U.S. PATENT DOCUMENTS

| | | | | |
|---|---|---|---|---|
| 2018/0269225 A1* | 9/2018 | Huang | ............... | H01L 27/11582 |
| 2019/0013328 A1* | 1/2019 | Kim | .................. | H01L 27/11582 |
| 2019/0035797 A1* | 1/2019 | Lee | .................. | H01L 27/11582 |
| 2019/0189688 A1* | 6/2019 | Lille | .................. | H01L 45/1616 |
| 2019/0259881 A1* | 8/2019 | Kim | .................. | H01L 27/11565 |

\* cited by examiner

SEMICONDUCTOR DEVICE AND MANUFACTURING METHOD THEREOF

This application is a Divisional of U.S. application Ser. No. 16/105,892, filed Aug. 20, 2018; which claims the benefit of and priority to Japanese Patent Application No. 2018-053207, filed Mar. 20, 2018, the entire contents of which are incorporated herein by reference.

FIELD

Embodiments described herein relate generally to a semiconductor device and manufacturing method thereof.

BACKGROUND

In manufacturing a three-dimensional semiconductor memory which is one of semiconductor devices, for example, an insulator is buried in a groove dividing a stacked body, and a hole is formed in a part of the groove using a mask.

DETAILED DESCRIPTION

Embodiments provide a semiconductor device capable of improving nonuniformity in film size and a manufacturing method thereof.

In general, according to one embodiment, a semiconductor device may include a substrate, a stacked body, a first insulator, a second insulator, a first hole, and a first insulating member. The stacked body may be provided on the substrate, and a plurality of layers may be stacked in a first direction perpendicular to the upper surface of the substrate. The first insulator may divide the stacked body in a second direction crossing the first direction. The second insulator may be adjacent to the first insulator and divides the stacked body in the second direction. The first hole may penetrate the stacked body and the first insulator in the first direction. The first insulating member may penetrate the stacked body and the second insulator in the first direction and may be adjacent to the first hole via a first electrode in a third direction crossing the first direction and the second direction, and may have an opening diameter larger than that of the first insulator.

An embodiment of the present disclosure will now be described with reference to the accompanying drawings. The embodiment does not limit the present disclosure.

First Embodiment

Figure 1:
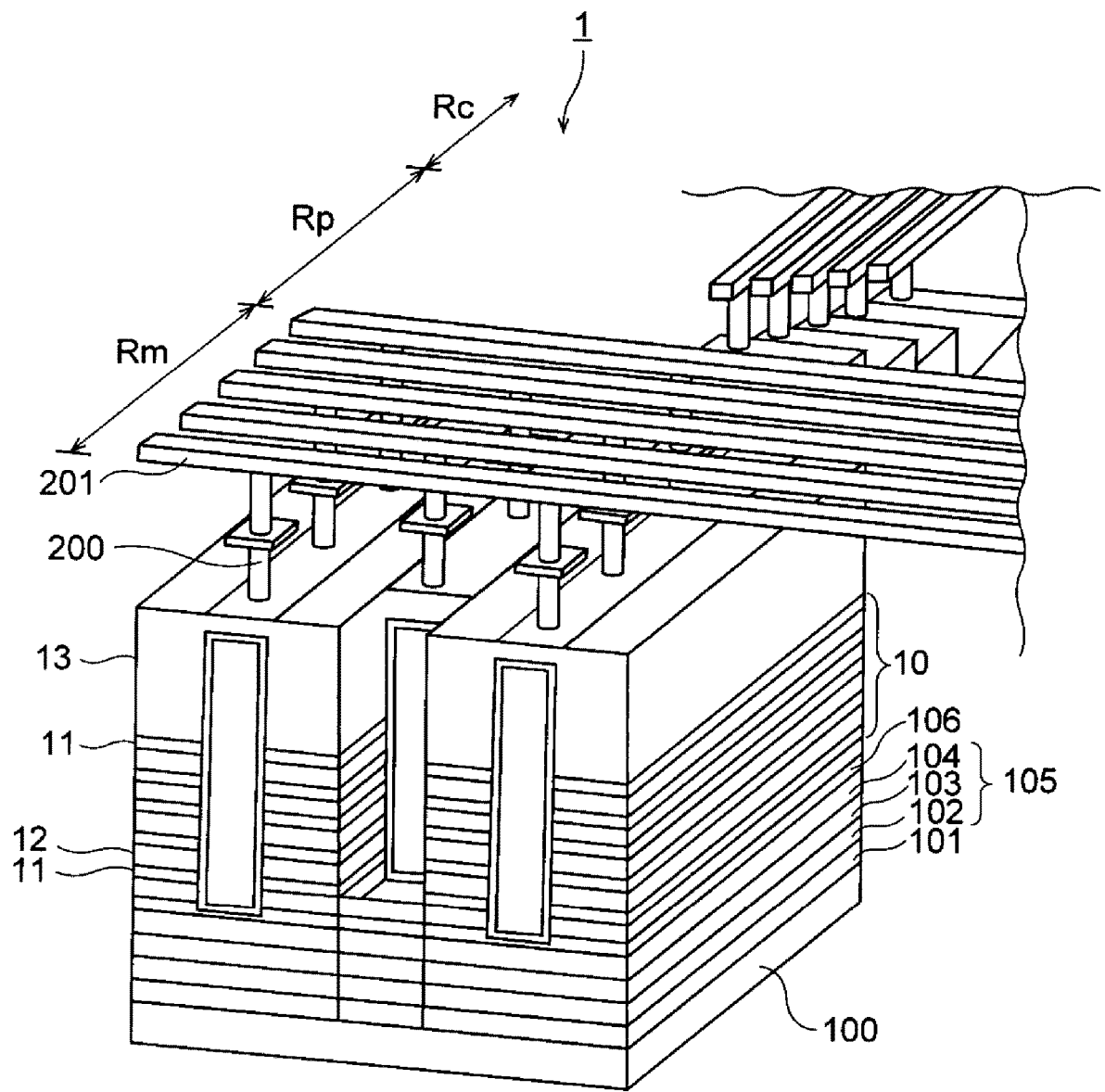
FIG. 1 is a perspective view schematically illustrating a configuration of a semiconductor device according to a first embodiment.

FIG. 1 is a perspective view schematically illustrating a configuration of a semiconductor device according to a first embodiment. Hereinafter, for convenience of explanation, an XYZ orthogonal coordinate system is used herein. Two directions parallel to the upper surface of a semiconductor substrate 100 and perpendicular to each other are referred to as the "X direction (or third direction)" and "Y direction (or second direction)", and a direction perpendicular to the upper surface of the semiconductor substrate is referred to as the "Z direction (or first direction)".

Referring to FIG. 1, the semiconductor substrate 100 including silicon or the like is provided in the semiconductor device 1 according to the first embodiment. A memory cell region Rm, a drawing region Rp, and a peripheral circuit region Rc are set in the semiconductor substrate 100.

In the memory cell region Rm, an insulating film 101, a conductive layer 102, a wiring layer 103, and a conductive layer 104 are stacked on the semiconductor substrate 100 in this order. The insulating film 101 may be made of, for example, silicon oxide. The conductive layer 102 may be made of, for example, polysilicon. The wiring layer 103 may be made of, for example, tungsten. The conductive layer 104 may be made of, for example, polysilicon. A cell source line 105 includes the conductive layer 102, the wiring layer 103 and the conductive layer 104. An insulating layer 106 is formed or disposed on the cell source line 105. A stacked body 10 is provided on the insulating layer 106.

Figure 2A:
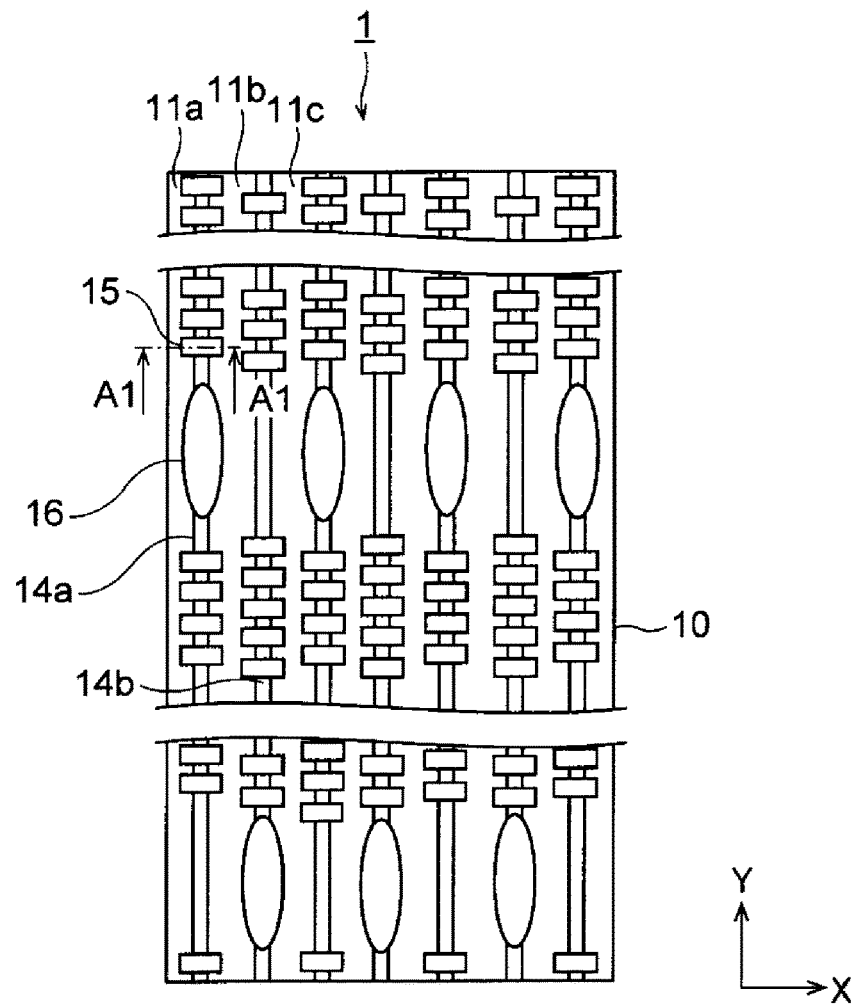
FIG. 2A is a plan view of a memory cell region according to the first embodiment.
Figure 2B:
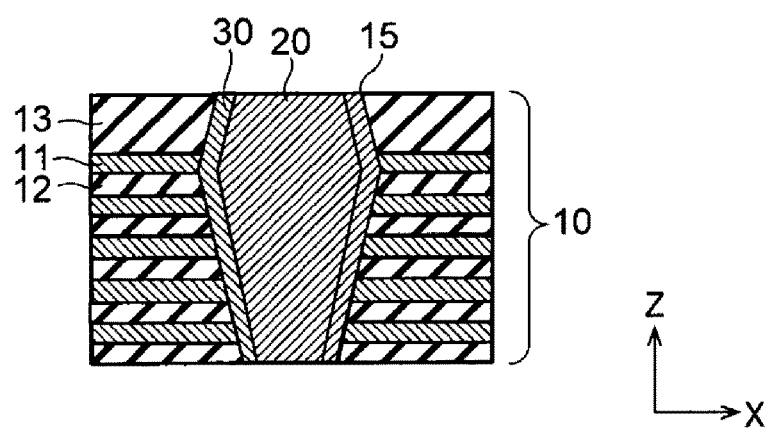
FIG. 2B is a cross-sectional view taken along a cutting line A1-A1 shown in FIG. 2A.
Figure 2C:
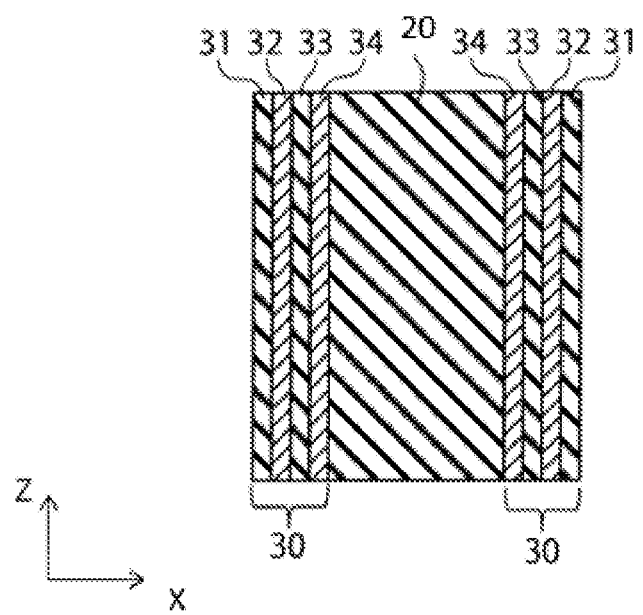
FIG. 2C is an enlarged view of memory cell films and an insulator shown in FIG. 2B.

FIG. 2A is a plan view of the memory cell region Rm according to the first embodiment. FIG. 2B is a cross-sectional view taken along a cutting line A1-A1 shown in FIG. 2A. FIG. 2C is an enlarged figure describing memory cell films 30 and an insulator 20 of FIG. 2B.

Referring to FIG. 2B, the stacked body 10 has conductive layers 11 and insulating layers 12. Each conductive layer 11 may contain, for example, tungsten (W), and functions as a word line. Each insulating layer 12 may be, for example, a silicon oxide (SiO$_2$) layer. The conductive layers 11 and the insulating layers 12 are alternately stacked. An insulating layer 13 is provided on the uppermost conductive layer 11. The insulating layer may be thicker than the insulating layer 12. The insulating layer 13 may be, for example, a silicon oxide layer. FIG. 2A is a plan view illustrating the conductive layer 11.

An insulator 20 is buried in a groove 14 (see FIG. 4B) dividing the stacked body 10 and extending in the Y direction. A plurality of first holes 15 may be formed in a part of the groove, and a second hole 16 may be formed in another part of the groove 14. The second hole 16 may be filled with the insulator 20 which is an example of the first insulating member. The insulator 20 may be, for example, a silicon oxide. Each first hole 15 may be formed to form a memory cell film 30. The second hole 16 may be formed to replace an insulating layer 111 (see FIG. 3B) described later with the conductive layer 11. As shown in FIG. 2A, the opening diameter of each of the first holes 15 and the second hole 16 may be wider than the groove 14.

As shown in FIGS. 2B and 2C, memory cell films 30 face each other across the insulator 20 in each first hole 15. Each memory cell film 30 may be composed of, for example, a multilayer film. The multilayer film may have, for example, memory films. Referring to FIG. 2C, each of the memory films may include a charge block film 31 containing silicon oxide, a charge storage film 32 containing silicon nitride 33, and a tunnel insulating film containing silicon oxide, and channel films (e.g., semiconductor layer) 34 each containing polysilicon. For example, the memory cell film 30 may include the memory films and the channel films. The lower end of each channel film may penetrate the insulating layer 106 (see FIG. 1), for example, and may be connected to the cell source line 105 (see FIG. 1). When viewed from the Z direction, the channel films may be arranged in a staggered pattern along the X direction and the Y direction. Each channel film may be led to the upper portion in the Z direction and connected to a bit line 201 (see FIG. 1) extending in the X direction through a via 200. In this manner, each channel film may be connected between the bit line 201 and the cell source line 105.

As shown in FIG. 2A, the conductive layer 11 including electrodes 11a, 11b, 11c is divided by a plurality of grooves 14 (e.g., grooves 14a and 14b). For example, an electrode 11a, and an electrode 11b electrically insulated from the electrode 11a are formed by the groove 14a. Further, an electrode 11c electrically insulated from the electrode 11b is formed by a groove 14b. For example, the electrode 11a and the electrode 11c may be electrically connected at the end portion in the Y direction (not shown). That is, in the first hole 15, two memory cell transistors may be respectively formed between two different adjacent electrodes and the memory cell films 30 formed in the first hole 15.

The manufacturing process of the semiconductor device 1 according to the first embodiment will now be described. It is noted that, in FIG. 3 to FIG. 8, each figure A is a top view, and each figure B is a cross-sectional view along a cutting line shown in each figure A.

Figure 3A:
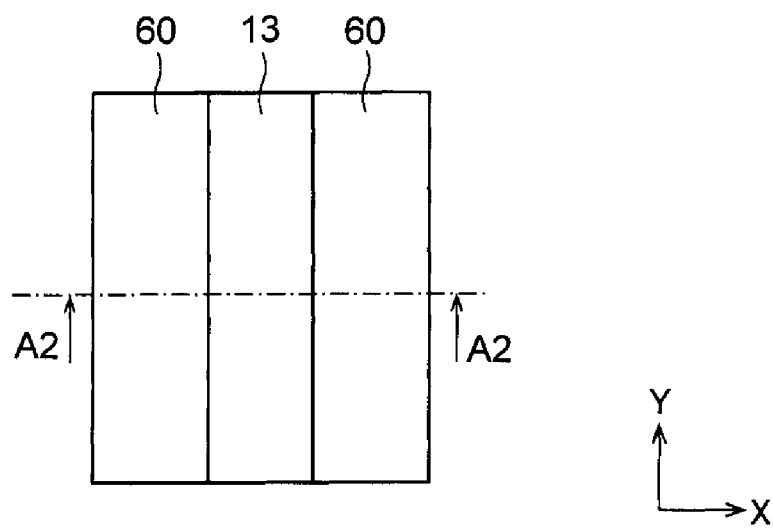
FIG. 3A is a plan view for explaining a patterning process of a stacked body.
Figure 3B:
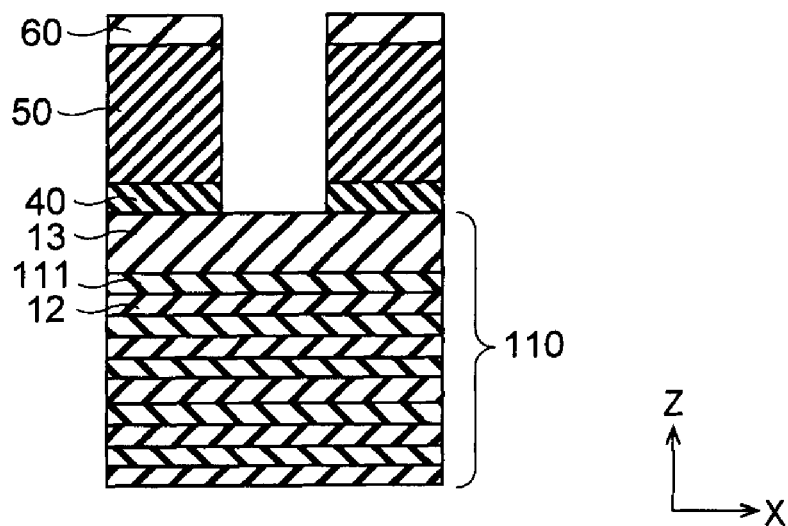
FIG. 3B is a cross-sectional view taken along a cutting line A2-A2 shown in FIG. 3A.

First, as shown in FIG. 3A and FIG. 3B, a hard mask 40 (or first film), a mask 50, and a mask 60 are formed on the stacked body 110. The mask 60 may be, for example, a silicon oxide layer and may form a line-shaped pattern. It is noted that, in the stacked body 110, insulating layers 111 and insulating layers 12 are alternately stacked. Each insulating layer 111 may be, for example, a silicon nitride (SiN) layer. The insulating layer 13 described above is provided on the uppermost insulating layer 111. Therefore, as shown in FIG. 3A, the insulating layer 13 is exposed from the line-shaped pattern. When the hard mask 40, the mask 50, and the mask 60 are processed into a line shape, the upper portion of the insulating layer 13 may be also etched.

Figure 4A:
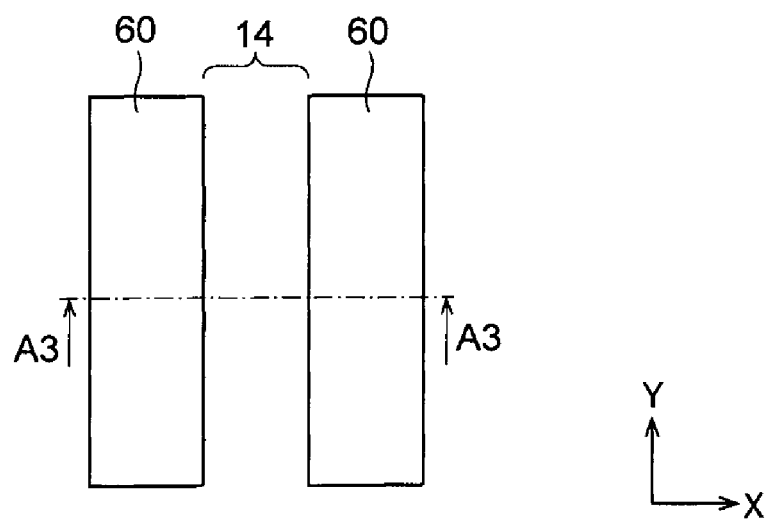
FIG. 4A is a plan view for explaining a dividing process of the stacked body.
Figure 4B:
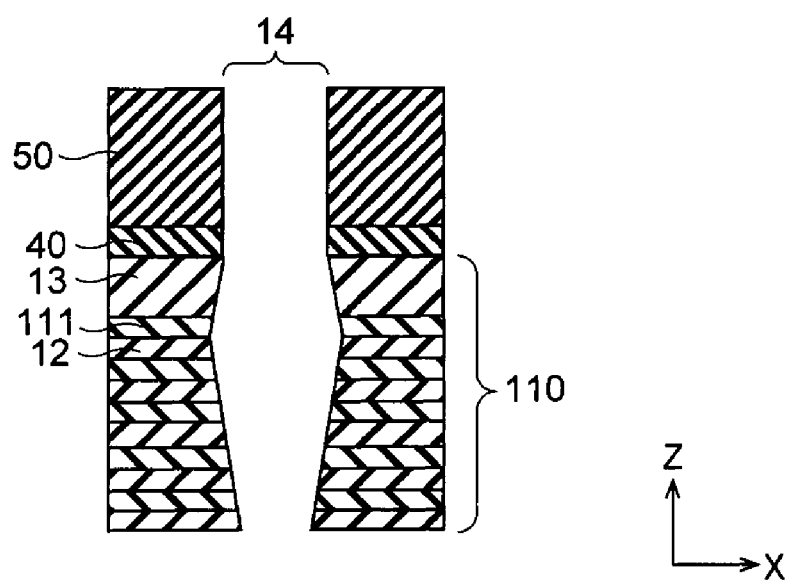
FIG. 4B is a cross-sectional view taken along a cutting line A3-A3 shown in FIG. 4A.

Next, as shown in FIG. 4A and FIG. 4B, the stacked body 110 may be processed using the hard mask 40, the mask 50, and the mask 60 as a mask. As a result, the groove 14 may be formed, and the stacked body 110 may be divided. During processing of the stacked body 110, the mask 60 and a part of the mask 50 may be removed. For example, after forming the groove 14, the remaining portion of the mask 50 may be removed. In some embodiments, a semiconductor substrate (not shown) or an under layer (not shown) may be provided between the semiconductor substrate and the stacked body 110 to be exposed from the groove 14. An example of the under layer includes, but not limited to, the above-mentioned cell source line or the like.

Figure 5A:
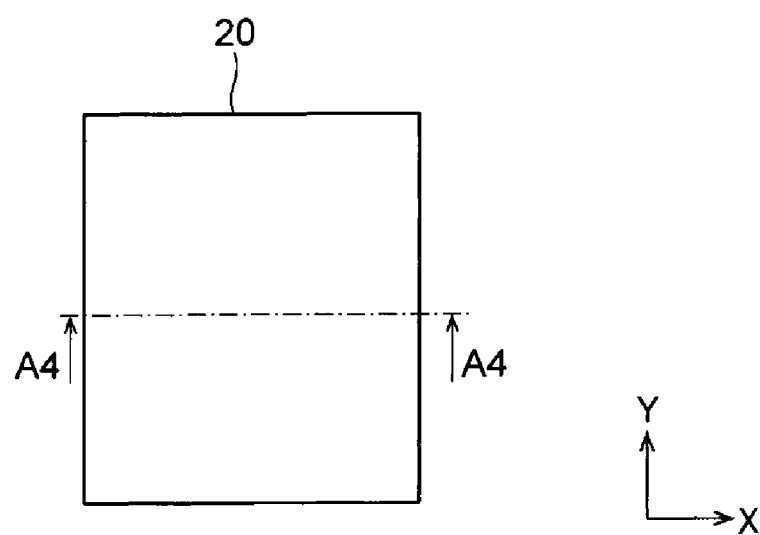
FIG. 5A is a plan view for explaining an embedding process of an insulator.
Figure 5B:
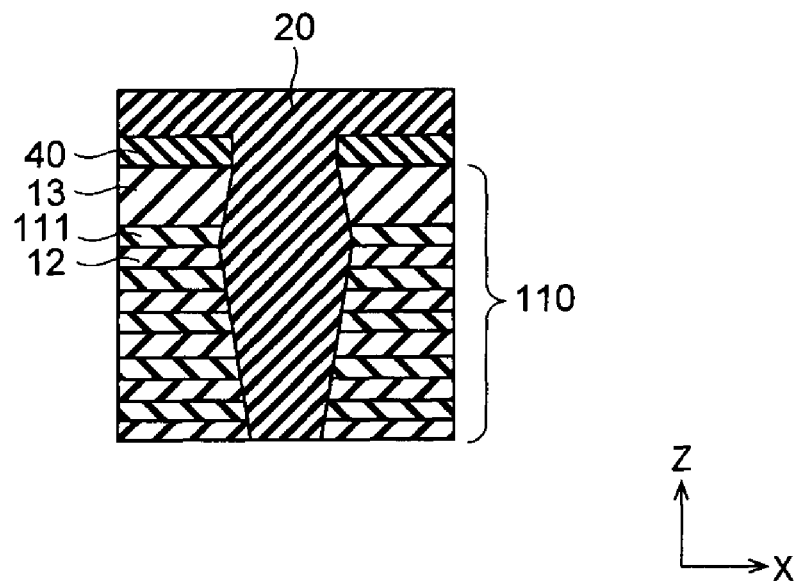
FIG. 5B is a cross-sectional view taken along a cutting line A4-A4 shown in FIG. 5A.
Figure 6A:
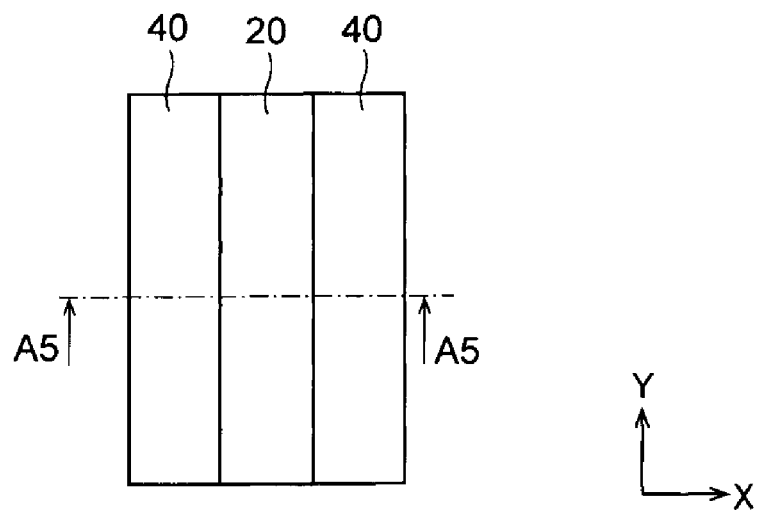
FIG. 6A is a plan view for explaining a dropping process of the insulator.
Figure 6B:
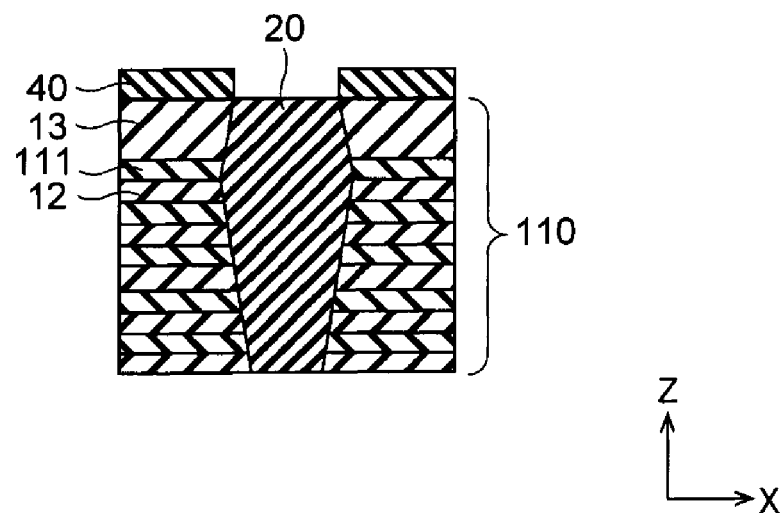
FIG. 6B is a cross-sectional view taken along a cutting line A5-A5 shown in FIG. 6A.

Next, as shown in FIG. 5A and FIG. 5B, the insulator 20 is embedded in the groove 14. At this time, the insulator 20 is also formed on the hard mask 40. Subsequently, as shown in FIG. 6A and FIG. 6B, the insulator is dropped to the bottom of the hard mask 40. For example, the insulator 20 may be etched such that its upper surface is at a level equal to or lower than a bottom surface of the hard mask 40. At this time, the hard mask 40 is not completely etched.

Figure 7A:
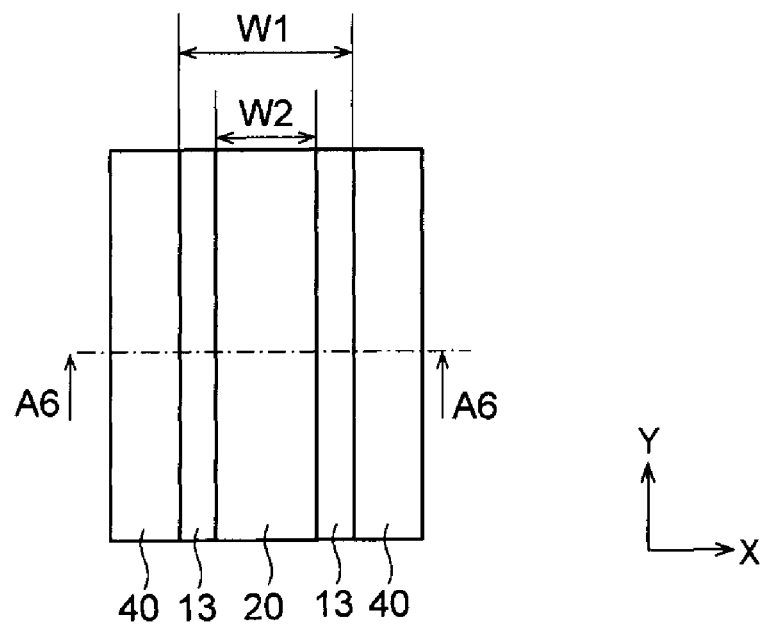
FIG. 7A is a plan view for explaining an etching-back process of a hard mask.
Figure 7B:
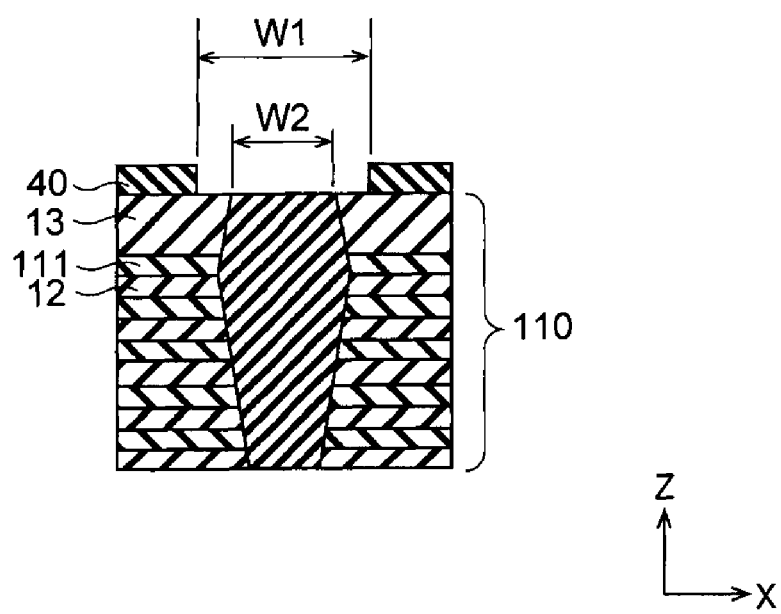
FIG. 7B is a cross-sectional view taken along a cutting line A6-A6 shown in FIG. 7A.

Next, as shown in FIG. 7A and FIG. 7B, the hard mask 40 is etched back by wet etching. As a result, the hard mask 40 retreats in the X direction, and the opening width W1 of the hard mask 40 becomes wider than the width W2 of the groove 14.

Figure 8A:
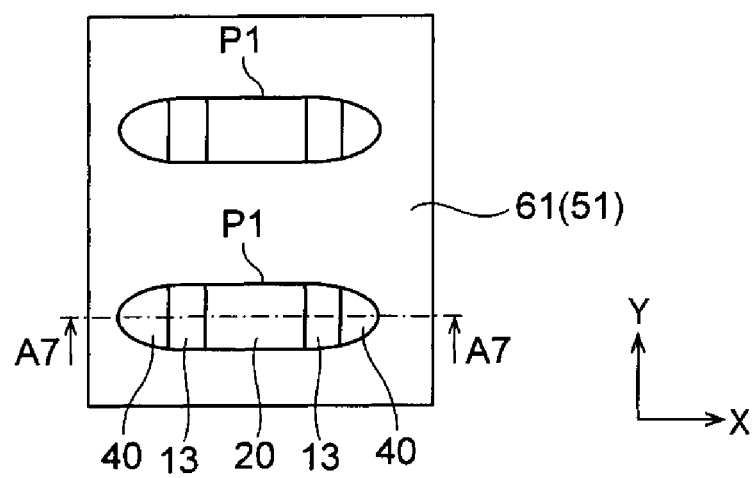
FIG. 8A is a plan view for explaining a forming process of a first hole.
Figure 8B:
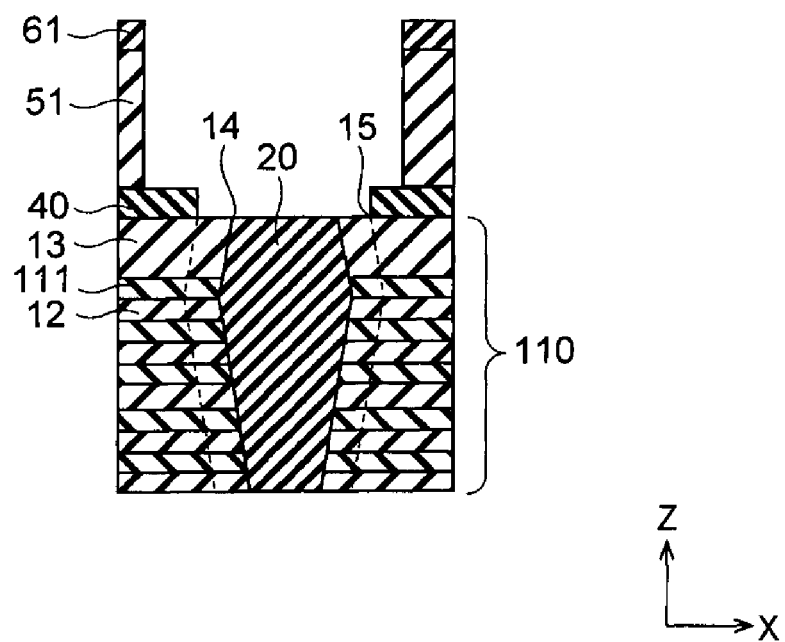
FIG. 8B is a cross-sectional view taken along a cutting line A7-A7 shown in FIG. 8A.

Next, as shown in FIG. 8A and FIG. 8B, a mask 51 (or second film) and a mask 61 are arranged on the hard mask 40. The mask 51 may include an elliptical patter P1. The elliptical pattern P1 may be formed to determine the formation position of the first hole 15. The shape of the pattern P1 is not limited to an elliptical shape, and the pattern P1 may have other shapes, for example, a line shape, a circular shape, or a rectangular shape.

The mask 51 may be, for example, a carbon film. The mask 61 may be, for example, a silicon oxide layer. The material of each of the hard mask 40 and the mask 51 may be selected such that the hard mask 40 is higher than the mask 51 with respect to the selection ratio to the stacked body 110. In other words, the hard mask 40 may be higher than the mask 51 with respect to the etching rate ratio of the stacked body 110.

When the center position of the pattern P1 deviates from the center position of the groove 14 at the time of forming the mask 51 and the mask 61, the memory cell films 30 may be formed such that the facing areas of the memory cell film 30 and the conductive layer are different on both sides of the first hole 15. Such unevenness may degrade the function as a storage element such as reading and writing of information.

Therefore, in the first embodiment, referring to FIG. 7A and FIG. 7B, the opening width W1 of the hard mask 40 is expanded so as to be wider than the width W2 of the groove 14. Therefore, the processing width of the first hole 15 (see the dotted line in FIG. 8B) is defined by the opening width W1 of the hard mask 40. In other words, the first hole 15 has the opening width W1 of the hard mask 40 in the X direction, and the opening width of the masks 51 and 61 in the Y direction (that is, the width of the pattern P1 in the Y direction). For example, referring to FIG. 8B, the masks 51 and 61 have an opening with an opening diameter larger than the diameter W1 of the opening on the hard mask 40 such that the opening of the masks 51 and 61 and the opening of the hard mask 40 at least partially overlap with each other.

Figure 9A:
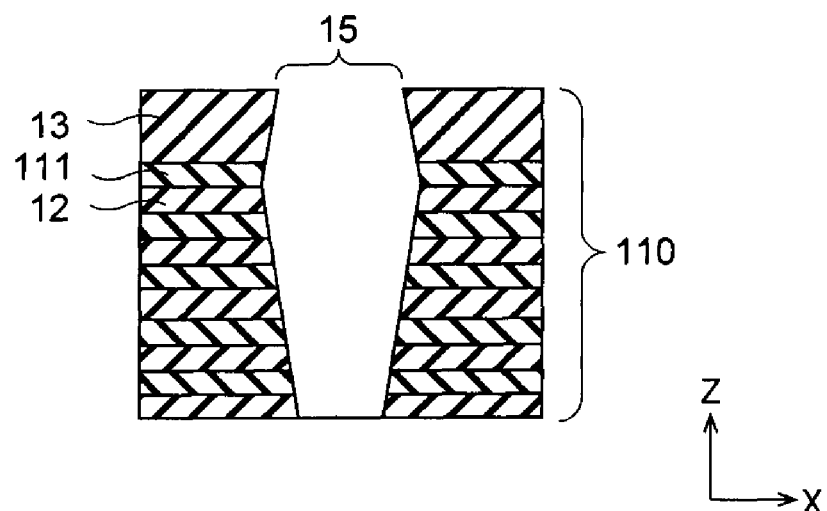
FIG. 9A is a cross-sectional view of the first hole.
Figure 9B:
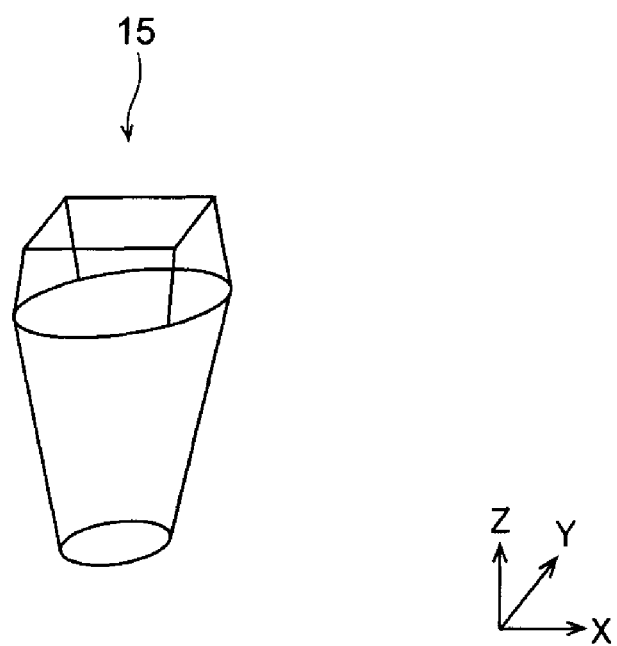
FIG. 9B is an external view of the first hole.

FIG. 9A is a cross-sectional view of the first hole 15. FIG. 9B is an external view of the first hole 15. The first hole 15 is formed using the etched back hard mask 40 as a mask. Therefore, as shown in FIG. 9B, the shape of each of the middle portion and the bottom portion of the first hole 15 (in the X-Y plane) is elliptical, whereas the shape of the upper end opening is quadrangular. The reason why the shape of each of the middle portion and the bottom portion is elliptical is that the shape of the upper end opening of the quadrangle becomes a shape that has rounded corners as etching progresses.

Figure 10:
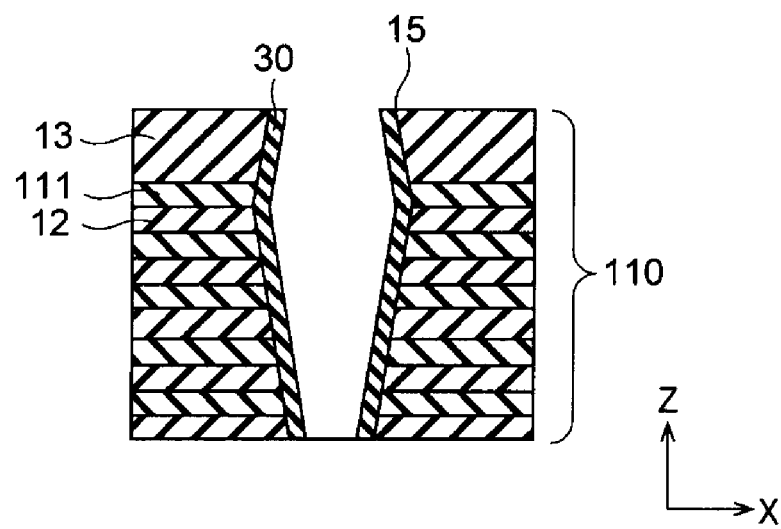
FIG. 10 is a cross-sectional view for explaining a forming process of a memory cell film in the first hole.
Figure 11:
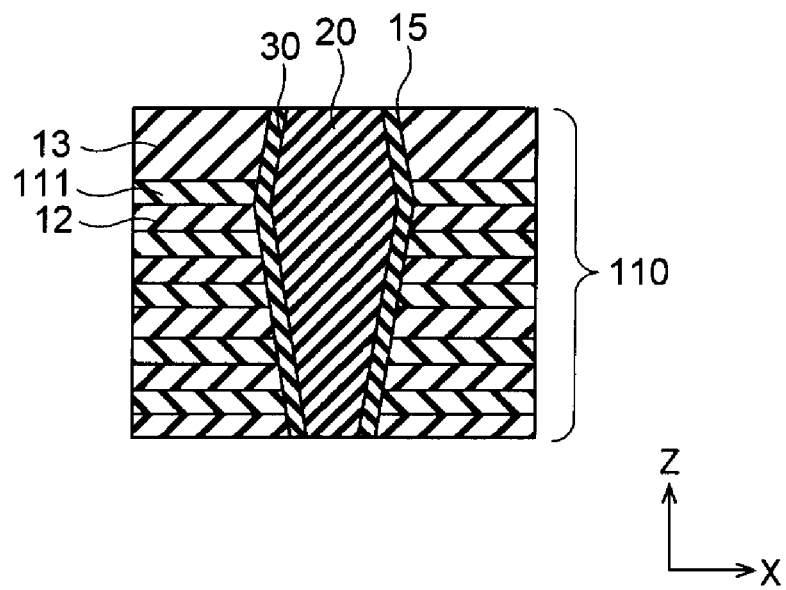
FIG. 11 is a cross-sectional view for explaining an embedding process of an insulator in the first hole.

Next, as shown in the cross-sectional view of FIG. 10, memory cell films 30 are formed on both sides of the first hole 15. Subsequently, as shown in the cross-sectional view of FIG. 11, the insulator 20 is buried between the memory cell films 30.

Thereafter, the second hole 16 (see FIG. 2A) is formed, and the insulating layer 111 is replaced with the conductive layer 11 through the formed second hole 16. For example, the insulating layer 111 may be removed through the second hole 16 by etching the insulating layer 111 (e.g., with an etching solution), and then the conductive layer 11 may be formed in the space at which the insulating layer 111 was previously disposed. After the replacement, the insulator 20 is buried in the second hole 16. Thus, the semiconductor device 1 shown in FIG. 1, FIG. 2A and FIG. 2B is manufactured.

According to the first embodiment described above, as shown in FIG. 7A and FIG. 7B, the opening width W1 of the hard mask 40 is expanded so as to be wider than the width W2 of the groove 14. Therefore, the processing width of the first hole 15 can be defined by the hard mask 40. As a result, compared to the case where no the hard mask 40 is used, the memory cell films 30 having the same facing area as that of the conductive layer can be formed on both sides of the first hole 15, thus, improving the size nonuniformity of the memory cell films 30.

Second Embodiment

Figure 12A:
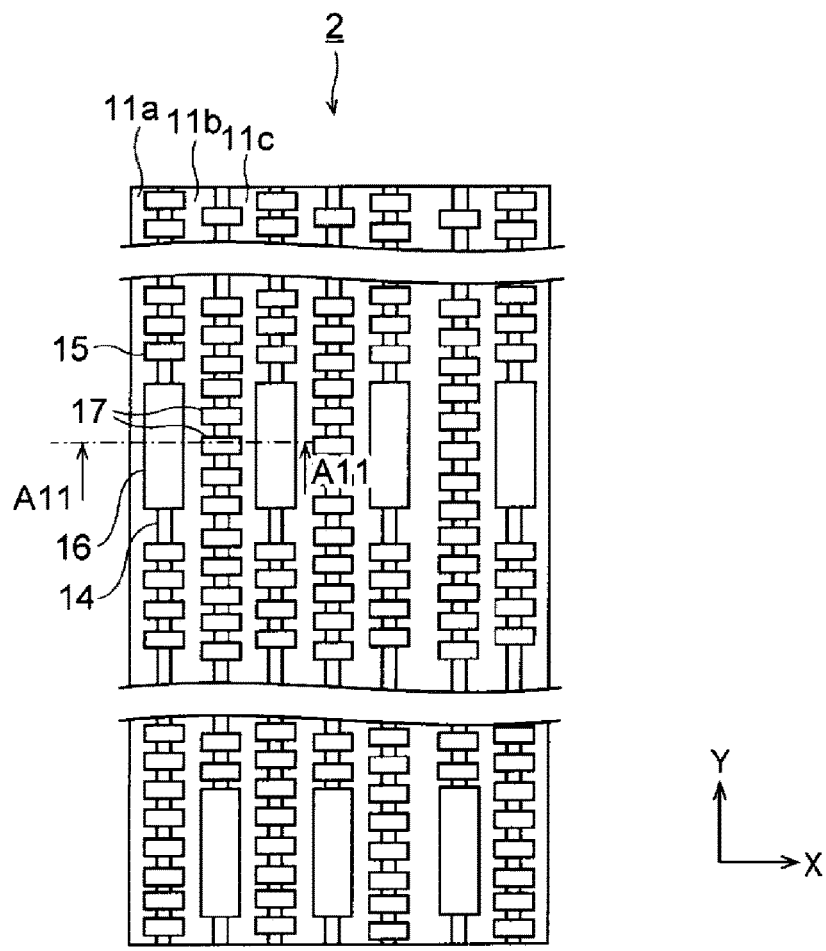
FIG. 12A is a plan view of a memory cell region according to a second embodiment.
Figure 12B:
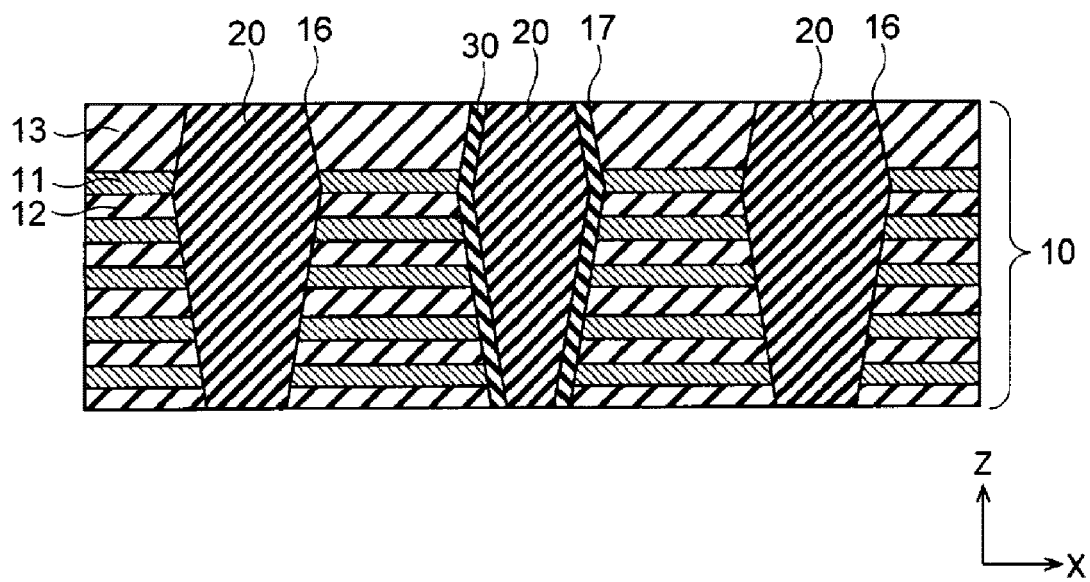
FIG. 12B is a cross-sectional view taken along a cutting line A11-A11 shown in FIG. 12A.

FIG. 12A is a plan view schematically illustrating a configuration of a semiconductor device according to a second embodiment. FIG. 12B is a cross-sectional view taken along a cutting line A11-A11 shown in FIG. 12A. In the second embodiment, components similar to those of the semiconductor device 1 according to the first embodiment described above are denoted by the same reference numerals, and detailed description thereof will be omitted.

In a semiconductor device 2 according to the second embodiment, as shown in FIG. 12A and FIG. 12B, second holes 16 are formed in regions facing each other across a first hole 17. The second embodiment differs from the first embodiment in that first holes 17 may be also formed between the second holes 16 in the X direction. A plurality of first holes 17 are formed between the second holes 16, and the first holes 17 are aligned at a first pitch. In the second embodiment, similar to the first embodiment, the conductive layer 11 is divided by a plurality of grooves 14, and has a plurality of electrodes 11a, 11b and 11c formed thereon. For example, although the electrode 11a and the electrode 11c are electrically connected at the end portion in the Y direction, the electrode 11a and the electrode 11b, and the electrode 11b and the electrode 11c are not electrically connected.

Figure 13A:
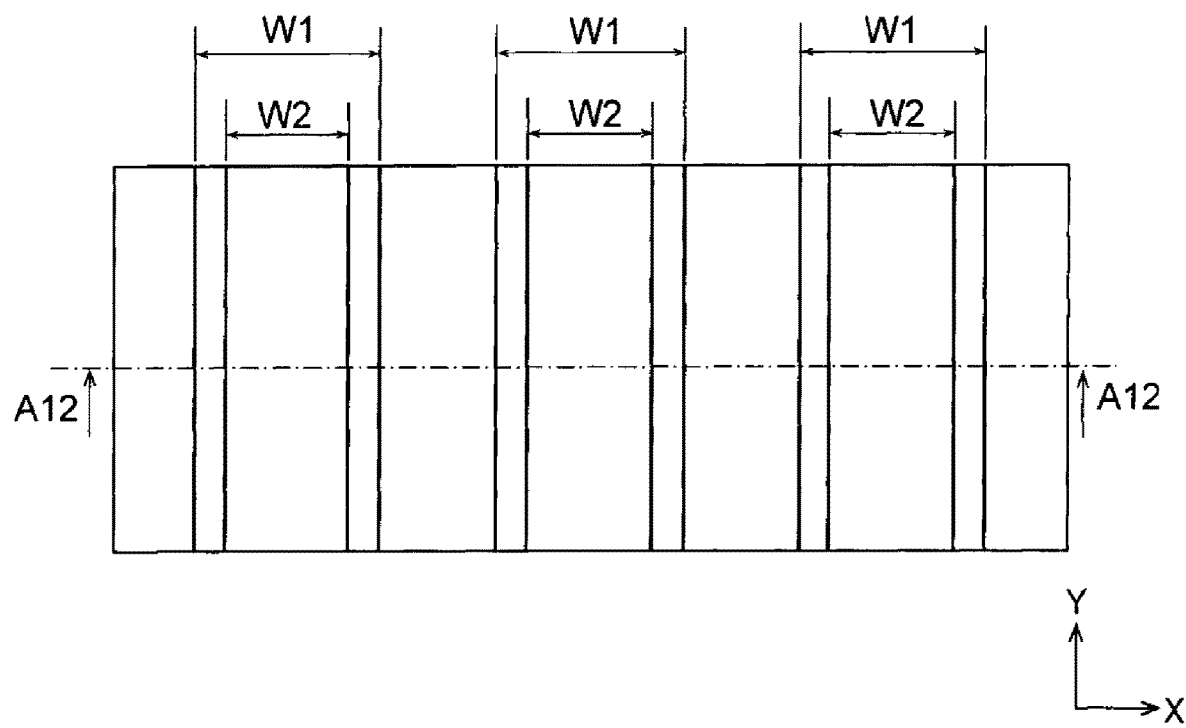
FIG. 13A is a plan view for explaining an etching-back process of a hard mask.
Figure 13B:
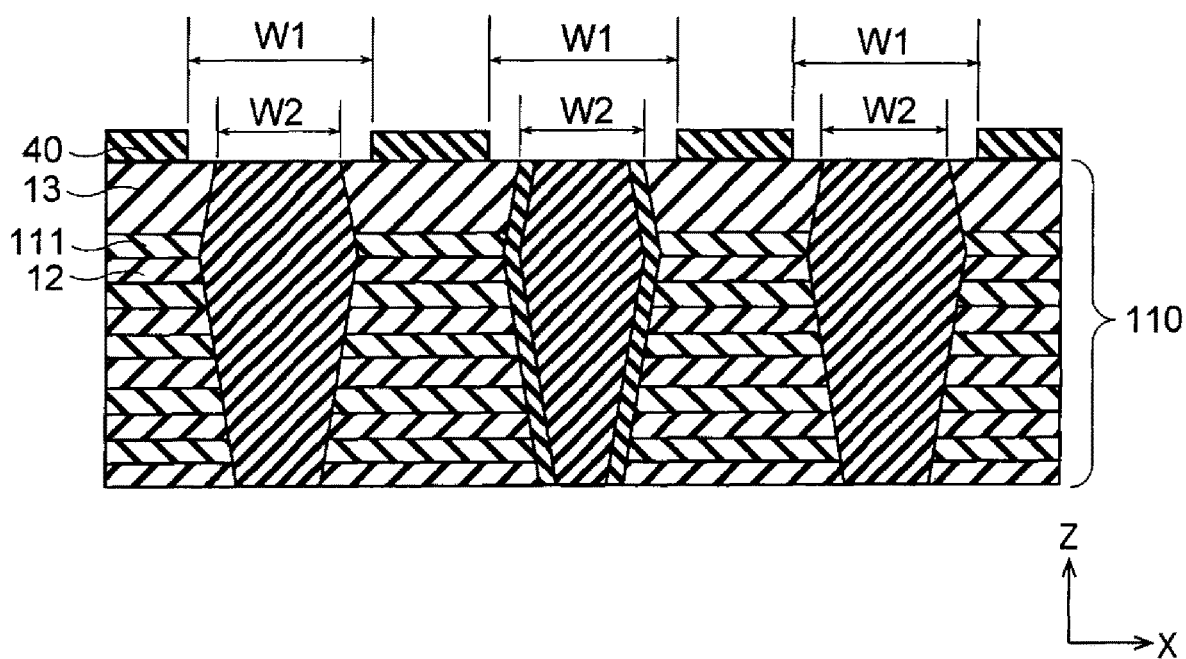
FIG. 13B is a cross-sectional view taken along a cutting line A12-A12 shown in FIG. 13A.

The first holes 17 may be simultaneously formed by the same method as the first holes 15 described in the first embodiment. Specifically, as shown in FIG. 13A and FIG. 13B, the hard mask 40 may be formed not only at the formation position of each first hole 17 but also at the formation position of each second hole 16, and may be etched back by wet etching. Thereafter, as described in the first embodiment, after forming the first holes 15 and 17, the memory cell films 30 may be formed in the first holes 15 and 17, and the insulator 20 may be buried therein. At this time, the mask 51 and the mask 61 may be formed so as to have an opening (pattern P1) only in each of the first holes 15 and 17. Thereafter, the masks 51 and 61 may be removed. At this time, the insulator 20 may be buried in the second hole 16.

Figure 14A:
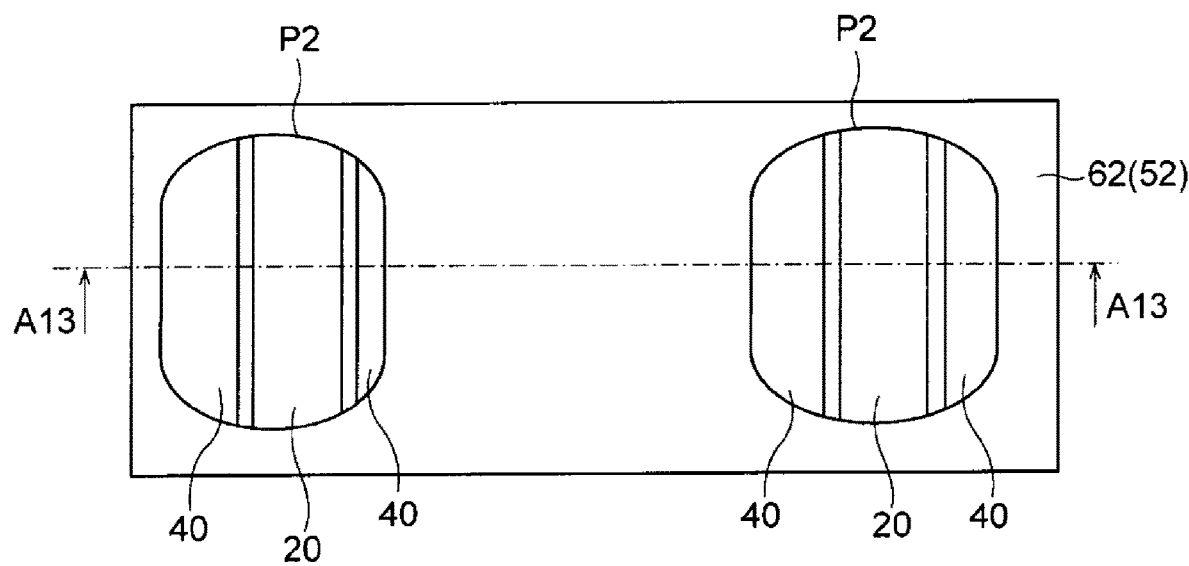
FIG. 14A is a plan view for explaining a forming process of a second hole.
Figure 14A:
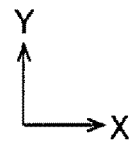
Figure 14B:
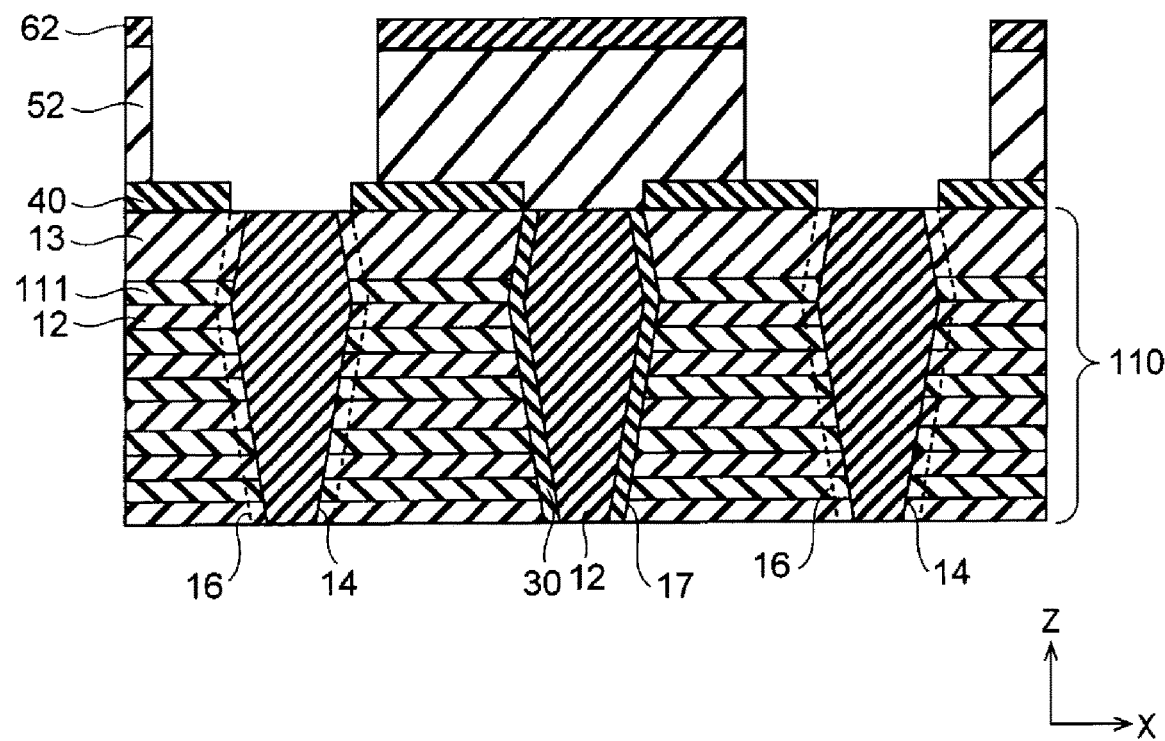
FIG. 14B is a cross-sectional view taken along a cutting line A13-A13 shown in FIG. 14A.

Next, as shown in FIG. 14A and FIG. 14B, a mask 52 (or third film) and a mask 62 are arranged on the hard mask 40. The mask 52 may include an elliptical pattern P2. The elliptical pattern P2 may be formed to determine the position of the second hole 16. At this time, each of the first holes 15 and 17 in which the memory cell films 30 are formed is covered with the mask 52.

The mask 52 may be, for example, a carbon film. The mask 62 may be, for example, a silicon oxide layer. The material of each of the hard mask 40 and the mask 52 may be selected such that the hard mask 40 is higher than the mask 52 with respect to the selection ratio to the stacked body 110. In other words, the hard mask 40 may be higher than the mask 52 with respect to the etching rate ratio of the stacked body 110.

When the center position of the pattern P2 deviates from the center position of the groove 14 at the time of forming the mask 52 and the mask 62, it becomes difficult to secure the formation region of the first hole 15 between the second holes 16. As a result, no memory cell film 30 can be formed between the second holes 16.

Figure 15:
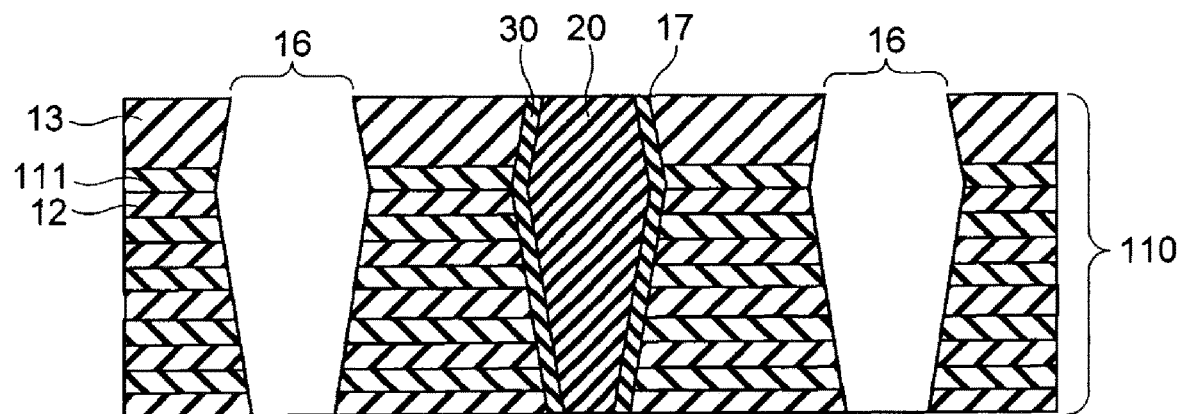
FIG. 15 is a cross-sectional view of the second hole.

Therefore, in the second embodiment, referring to FIG. 13A and FIG. 13B, the opening width W1 of the hard mask 40 is expanded so as to be wider than the width W2 of the groove 14 at the formation position of each second hole 16. Therefore, the processing width of the second hole 16 (see the dotted line in FIG. 14B) is defined by the opening width W1 of the hard mask 40. Therefore, as shown in FIG. 15, the second holes 16 can be formed on both sides of the first hole 15.

Figure 16:
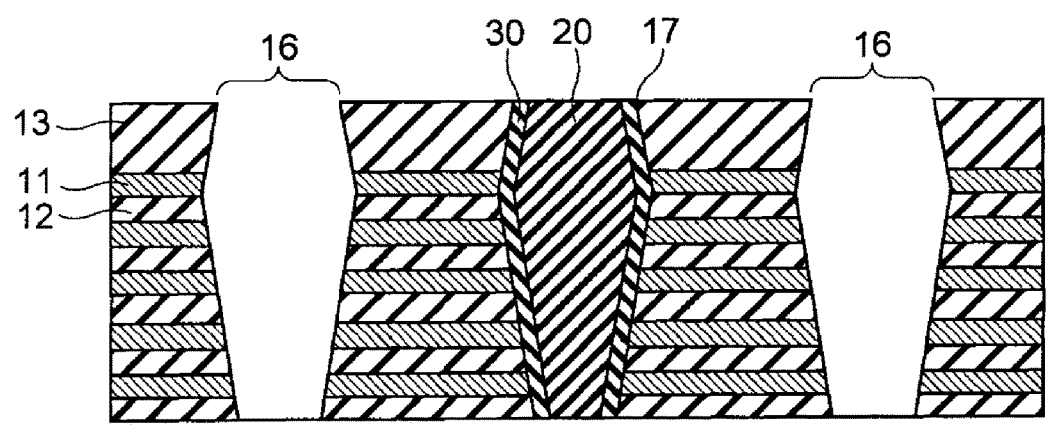
FIG. 16 is a cross-sectional view for explaining a substitution process from an insulating layer to a conductive layer.

Thereafter, the insulating layer 111 may be removed using, for example, high temperature phosphoric acid, and the conductive layer 11 may be formed in a cavity generated by removing the insulating layer 111. As a result, as shown in FIG. 16, the insulating layer 111 is replaced with the conductive layer 11. Finally, the insulator 20 is embedded in the second hole 16. In this way, the semiconductor device 2 shown in FIG. 12A and FIG. 12B is manufactured. Although an example in which the second holes 16 are formed after forming the first holes 15 and 17 is shown in the second embodiment, the first holes 15 and 17 and the second holes 16 may be formed at the same time. In that case, a mask having the pattern P1 and the pattern P2 may be formed on the hard mask.

According to the embodiment described above, by expanding the opening width W1 of the hard mask 40 so as to be wider than the width W2 of the groove 14, not only the processing width of the first holes 15 and 17 but also the processing width of the second hole 16 can also be specified by the hard mask 40. Therefore, since the formation regions of the first holes 17 can be secured between the second holes 16, the memory cell films 30 having the same size can be formed on both sides of the first hole 15. As a result, the storage capacity can be increased.

While certain embodiments have been described, these embodiments have been presented by way of example only, and are not intended to limit the scope of the present disclosure. Indeed, the novel embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure.

What is claimed is:

1. A method of manufacturing a semiconductor device, comprising:
    forming an insulator dividing a stacked body in which a plurality of layers are stacked in a first direction,
    forming a first film on the stacked body, the first film having a first opening so that a part of the stacked body and the insulator are exposed from the first film,
    forming a second film on the first film, the second film having a second opening with an opening dimension that is larger than a dimension of the first opening in a second direction and is smaller than a dimension of the first opening in a third direction such that the first opening and the second opening at least partially overlap with each other, wherein both the second direction and the third direction are perpendicular to the first direction; and
    etching the stacked body and the insulator in the first direction using the second film as a mask.

2. The method of manufacturing a semiconductor device according to claim 1, wherein the second film has an etching rate ratio for etching the stacked body lower than an etching rate ratio of the first film.

3. The method of manufacturing a semiconductor device according to claim 1, wherein the second opening includes a circular shape.

4. The method of manufacturing a semiconductor device according to claim 1, further comprising:
    forming a first hole by the etching; and
    forming memory cell films in the first hole, wherein the memory cell films including a first insulating layer, a second insulating layer, a third insulating layer and a semiconductor layer.

5. The method of manufacturing a semiconductor device according to claim 4,
    wherein the plurality of layers include two kinds of insulating layers having different materials, stacked alternately,
    the method further comprising:
    forming a second hole having an opening diameter larger than an opening diameter of the insulator in another part of the insulator facing each other across the first hole using the first film after the formation of the first hole;
    replacing one of the two kinds of insulating layers with a conductive layer using the second hole; and
    burying an insulating material in the second hole.

6. The method of manufacturing a semiconductor device according to claim 5, wherein
    the second hole is formed by arranging a third film having a third opening on the first film at a position different from the formation position of the first hole, and
    the third film has an etching rate ratio for etching the stacked body lower than an etching rate ratio of the first film.

* * * * *